United States Patent
Gutberlet et al.

(10) Patent No.: US 7,353,491 B2
(45) Date of Patent: Apr. 1, 2008

(54) OPTIMIZATION OF MEMORY ACCESSES IN A CIRCUIT DESIGN

(76) Inventors: Peter Pius Gutberlet, 28810 SW. Ashland Dr., #255, Wilsonville, OR (US) 97070; Michael F. Fingeroff, 3018 SE. Brooklyn St., Portland, OR (US) 97202; Andres R. Takach, 29019 SW. Meek Lp., Apt. 256, Wilsonville, OR (US) 97070

( * ) Notice: Subject to any disclaimer, the term of this patent is extended or adjusted under 35 U.S.C. 154(b) by 336 days.

(21) Appl. No.: 11/173,683

(22) Filed: Jul. 1, 2005

(65) Prior Publication Data
US 2005/0273752 A1 Dec. 8, 2005

Related U.S. Application Data

(63) Continuation-in-part of application No. 10/985,398, filed on Nov. 10, 2004.

(60) Provisional application No. 60/575,210, filed on May 28, 2004, provisional application No. 60/689,406, filed on Jun. 10, 2005.

(51) Int. Cl.
  *G06F 17/50* (2006.01)
  *G06F 9/45* (2006.01)
(52) U.S. Cl. .................. 716/18; 717/150; 717/151
(58) Field of Classification Search .............. 716/18; 717/136, 150–151, 154, 160; 711/100
See application file for complete search history.

(56) References Cited

U.S. PATENT DOCUMENTS

| | | | | |
|---|---|---|---|---|
| 5,502,645 A | * | 3/1996 | Guerra et al. ............ | 716/18 |
| 6,064,819 A | * | 5/2000 | Franssen et al. .......... | 717/156 |
| 6,064,820 A | * | 5/2000 | Subrahmanyam .......... | 717/160 |
| 6,175,957 B1 | * | 1/2001 | Ju et al. .................. | 717/156 |
| 6,609,088 B1 | * | 8/2003 | Wuytack et al. .......... | 703/22 |
| 6,651,246 B1 | * | 11/2003 | Archambault et al. ..... | 717/160 |
| 6,694,310 B1 | * | 2/2004 | Yu et al. .................. | 707/4 |
| 6,745,160 B1 | * | 6/2004 | Ashar et al. .............. | 703/14 |
| 6,952,821 B2 | * | 10/2005 | Schreiber ................. | 717/151 |
| 7,143,388 B1 | * | 11/2006 | Miller et al. .............. | 716/18 |
| 7,168,059 B2 | * | 1/2007 | Bowyer et al. ............ | 716/18 |

(Continued)

OTHER PUBLICATIONS

U.S. Appl. No. 60/285,656, filed Apr. 20, 2001, Burnette et al.

(Continued)

*Primary Examiner*—Stacy Whitmore
(74) *Attorney, Agent, or Firm*—Klarquist Sparkman, LLP

(57) ABSTRACT

Methods and apparatus for optimizing memory accesses in a circuit design are described. According to one embodiment, a method comprises identifying a subset of variables from a multi-variable memory space that are accessed by a plurality of loops, storing the subset of variables in a separately accessible memory space, and accessing one of the stored subset of variables to recover a stored value of the one of the stored subset of variables for use by at least one of the plurality of loops during synthesis. According to another embodiment, a method comprises identifying at least a first loop and a second loop, determining whether a dependency exists between the first loop and the second loop, and merging the first loop and the second loop into a single merged loop, wherein the merging comprises mapping a plurality of memory accesses from the first loop to a sliding window.

14 Claims, 6 Drawing Sheets

U.S. PATENT DOCUMENTS

| | | | |
|---|---|---|---|
| 7,194,724 B2* | 3/2007 | Hattori et al. | 716/18 |
| 2001/0009032 A1* | 7/2001 | Mohsen | 716/15 |
| 2001/0034876 A1* | 10/2001 | Panchul et al. | 716/18 |
| 2003/0005404 A1 | 1/2003 | Bowyer et al. | |
| 2003/0121010 A1* | 6/2003 | Aubury | 716/4 |
| 2003/0196181 A1* | 10/2003 | Sano et al. | 716/4 |
| 2007/0006112 A1* | 1/2007 | Gutberlet et al. | 716/18 |

OTHER PUBLICATIONS

Tannenbaum, "Mercury Optimization," 3 pages, http://www.cs.rpi.edu/~tannenp/group/lcr/node4.html, Jun. 12, 1999.

Tannenbaum, "Well-Formed Loops," 2 pages, http://www.cs.rpi.edu/~tannenp/group/lcr/node5.html, Jun. 12, 1999.

Tannenbaum, "Generating and Merging Well-Formed Loops," 2 pages, http://www.cs.rpi.edu/~tannenp/group/lcr/node6.html, Jun. 12, 1999.

Tannenbaum, "Parallelization," 2 pages, http://www.cs.rpi.edu/~tannenp/group/lcr/node7.html, Jun. 12, 1999.

Tannenbaum, "Creation of Pipeline Loops," 2 pages, http://www.cs.rpi.edu/~tannenp/group/lcr/node8.html, Jun. 12, 1999.

Tannenbaum, "Optimizing Pipelines for Target Architectures," 2 pages, http://www.cs.rpi.edu/~tannenp/group/lcr/node9.html, Jun. 12, 1999.

Tannenbaum, "Conclusions," 1 page, http://www.cs.rpi.edu/~tannenp/group/lcr/node10.html, Jun. 12, 1999.

Feist, "What's in a Language?" *The AccelChip Accelerator*, Issue 2, 3 pages, May 2004.

Danckaert et al., "A Loop Transformation Approach for Combined Parallelization and Data Transfer and Storage Optimization," Proc. ACM Conf. on Par. and Dist. Proc. Techniques and Applications, PDPTA'00, pp. 2591-2597, Las Vegas, NV, Jun. 2000.

Lehtinen, "Loop Transformations and Indexing Functions," 17 pages, http://www.abo.fi/~Johan.Lilius/G612/Topic2.pdf, website visited on May 25, 2004.

"Chapter 1: Designing with Precision C Synthesis," *Precision™C Synthesis Users and Reference Manual: Software Release 2004a*, Mentor Graphics Corporation, pp. 1-1-1-21, Mar. 2004.

"Chapter 3: Design Optimization," *Precision™C Synthesis Users and Reference Manual: Software Release 2004a*, Mentor Graphics Corporation, pp. 3-1-3-44, Mar. 2004.

\* cited by examiner

OPTIMIZATION OF MEMORY ACCESSES IN A CIRCUIT DESIGN

CROSS-REFERENCES TO RELATED APPLICATIONS

This application is a continuation-in-part application of U.S. patent application Ser. No. 10/985,398, filed Nov. 10, 2004, which claims the benefit of U.S. Provisional Application No. 60/575,210, filed May 28, 2004, both of which are incorporated herein by reference. This application also claims the benefit of U.S. Provisional Application No. 60/689,406, filed Jun. 10, 2005.

FIELD

This application relates generally to behavioral synthesis tools for creating integrated circuits (e.g., field programmable gate arrays) and, more particularly, relates to the optimization of memory accesses in a circuit design.

BACKGROUND

With the advent of electronic design automation (EDA), the design of complex hardware systems no longer begins with a hardware circuit diagram. Instead, circuit design typically begins with a software program that describes the behavior or functionality of the hardware system. In one exemplary approach, the behavior or functionality of an electronic circuit design may be described using a hardware-description language (HDL) (e.g., VHDL, Verilog, or other such language). Circuit designers direct behavioral synthesis tools to generate alternate architectures by modifying constraints (e.g., clock period, number and type of data path elements, and desired number of clock cycles). Behavioral synthesis tools convert the HDL program into a register transfer level (RTL) description. The RTL description is used to ultimately generate a netlist that includes a list of components in the circuit and the interconnections between the components. This netlist is used to create the physical integrated circuit.

An example of HDL source code, shown in Table 1 below, declares three variables (a, b, and c) that are arrays. Each array contains 1024 8-bit words. The code first declares a "subtype" to define the type of each element in the array. The code then defines a "type" to represent the array itself. Finally, the variables are declared, each variable representing an array.

TABLE 1

SUBTYPE word IS unsigned (7 DOWNTO 0);
TYPE array_type IS ARRAY (integer RANGE < > ) of word;
VARIABLE a, b, c: array_type (0 to 1023);

Generally, the variables can be accessed using loops, such as the loop shown below in Table 2. When an array is mapped to memory, each element in the array is mapped to a memory location. For example, a(0) maps to address 0, a(1) maps to address 1, and a(1023) maps to address 1023.

TABLE 2

FOR i IN 0 TO 15 LOOP
 a(i) = b (i) * c(i) + 4;
END LOOP;

After the designer completes the HDL source code, the designer may run the source code through the synthesis tool. A typical synthesis tool generates a report that the designer can use to analyze the performance of the circuit. For example, the user can examine the area and latency of the circuit to determine whether the current loop configuration is acceptable. If the loop configuration is not acceptable, the designer typically returns to an editor, re-edits the source code to unroll or pipeline loops, and runs the source code through the synthesis tool again. Such a technique for modifying the design is time consuming and inefficient. Moreover, the designer cannot easily visualize how the loop configuration changes the design while modifying the source code.

RTL methodologies have previously sufficed to simulate and design simple hardware blocks but today fall far short in many ways. Design complexity of new digital signal processing (DSP) applications has outpaced traditional RTL methods. As such, designers have moved to C++ or Matlab® to quickly validate their algorithms. While this higher abstraction has helped system verification, it has also widened the technology gap between the system designers using high-level languages and the hardware designers who hand-code the RTL.

Designs have evolved from single- or multi-block functional units into large systems that include embedded cores and complex hardware implementing proprietary compute-intensive algorithms. Despites these advances, engineers still use iterative RTL methods that involve manual steps such as micro-architecture definition, handwritten RTL, and area/speed optimization through RTL synthesis. This process is slow and error-prone. Moreover, since both the micro-architecture and destination technology characteristics are hard-coded into the RTL description, the whole notion of RTL reuse or retargeting becomes impractical for real applications.

SUMMARY

Optimizing memory accesses in a design would provide several advantages. For example, a much higher throughput design is possible if code is restructured to reduce the frequency of memory accesses. Additionally, it would be much more efficient to only store the parts of an array that are actually being used. Such methods can be used, for example, in implementing a design for an Application Specific Integrated Circuit (ASIC) or field programmable gate array (FPGA) or other such programmable logic device.

One of the disclosed embodiments is an exemplary method for designing a hardware circuit in a behavioral synthesis tool. This method involves storing variables that are used in the design. According to this method, variables are identified that are accessed within different loops. Once identified, these variables are stored in a separate memory space. The stored variables can later be accessed to allow for the recovery of a stored value of one or more of the variables. In some embodiments, a sliding window is constructed to which memory accesses are mapped.

Another of the disclosed embodiments is an exemplary method for designing integrated circuits (e.g., FPGAs). According to this method, at least two loops are identified and a determination is made as to whether a dependency exists between the loops. The loops are then merged, and memory accesses are mapped to a sliding window. In some embodiments, the sliding window is a subset of a multi-dimensional array.

Another disclosed embodiment is a video line filter system that includes a first line buffer, a second line buffer, and a video line filter. The video line filter reads pixels from the first line buffer and writes pixels to the second line buffer. The video line filter also maps various memory accesses to a sliding window. In some embodiments, the sliding window is implemented as a shift register. In some embodiments, the video line filter includes a merged loop, the merged loop being the result of two or more loops being merged together.

Any of the disclosed embodiments may be performed by a computer programmed with computer-executable instructions stored on a computer-readable medium. In these embodiments, the computer-executable instructions cause the computer to perform any of the disclosed embodiments. Moreover, any of the disclosed embodiments can be used to update or modify circuit design information stored on a computer-readable medium. Accordingly, modified design databases storing circuit designs retimed by the methods described herein are also disclosed. Such methods can be performed, for instance, on a stand-alone workstation or via a network.

The foregoing and other objects, features, and advantages of the invention will become more apparent from the following detailed description, which proceeds with reference to the accompanying figures.

DETAILED DESCRIPTION

Disclosed below are representative embodiments of methods for analyzing and processing loops within a circuit design. The disclosed methods should not be construed as limiting in any way. Instead, the present disclosure is directed toward novel and non-obvious features and aspects of the various disclosed embodiments, alone and in various combinations and sub-combinations with one another. The methods are not limited to any specific aspect or feature or combinations thereof, nor do the disclosed methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

The disclosed embodiments can be applied to a wide variety of sequential integrated circuits. A sequential integrated circuit (or sequential circuit) is one whose outputs depend not only on its current inputs, but also on the past sequence of inputs, possibly arbitrarily far back in time. Examples of sequential circuits include programmable logic devices (PLDs) such as field programmable gate arrays (FPGAs), application-specific integrated circuits (ASICs), and systems-on-a-chip (SoCs). A sequential circuit contains at least one sequential circuit element, such as a flip-flop, synchronous RAM element, or latch. A sequential circuit element (or sequential element) generally refers to any circuit element whose outputs state changes occur at times specified by a free-running clock signal.

Any of the disclosed methods can be performed using software stored on a computer-readable medium and executed on a computer. Such software can comprise, for example, an electronic-design-automation (EDA) software tool used, for instance, for logical or physical synthesis. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in detail.

Integrated Circuit Generation

Figure 1:
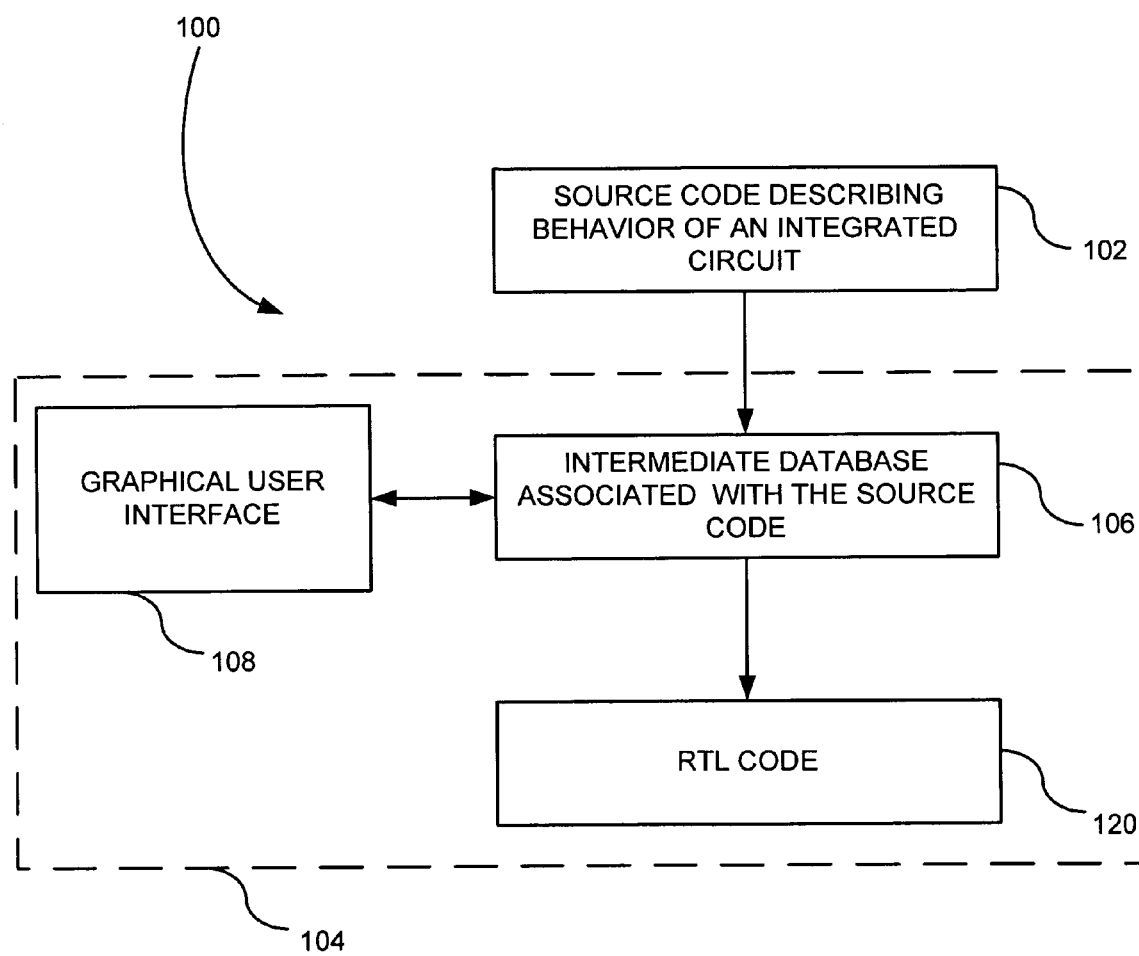
FIG. 1 is a block diagram showing an exemplary system for generating an integrated circuit.

FIG. 1 shows a system 100 for generating an integrated circuit. A designer typically creates a behavioral description of an integrated circuit by generating source code file 102 using a separate editor (not shown). The source code is described generically as HDL and may be written in C, C++, VHDL, Verilog, or any other suitable language. The source code might also be written in a C++ derivative language such as SystemC. Once the source code 102 is complete, a behavioral synthesis tool 104 reads in the source code file 102 and allows a designer to evaluate and modify the circuit architecture early in the design process. In particular, the source code 102 may be read into an intermediate database 106 that holds the behavioral description as a data structure. This data structure, called a synthesis intermediate format (SIF), is modifiable by the user such as through use of a graphical user interface (GUI) 108. Once the designer is satisfied with the architecture, the RTL code is generated as shown at 120. Further processing is then performed on the RTL code to ultimately generate the integrated circuit. The behavioral synthesis tool 104 may be executed on any desired general purpose computer having any display device or monitor for displaying the GUI and having any desired user input, such as a mouse, keyboard, or any other input device.

Figure 2:
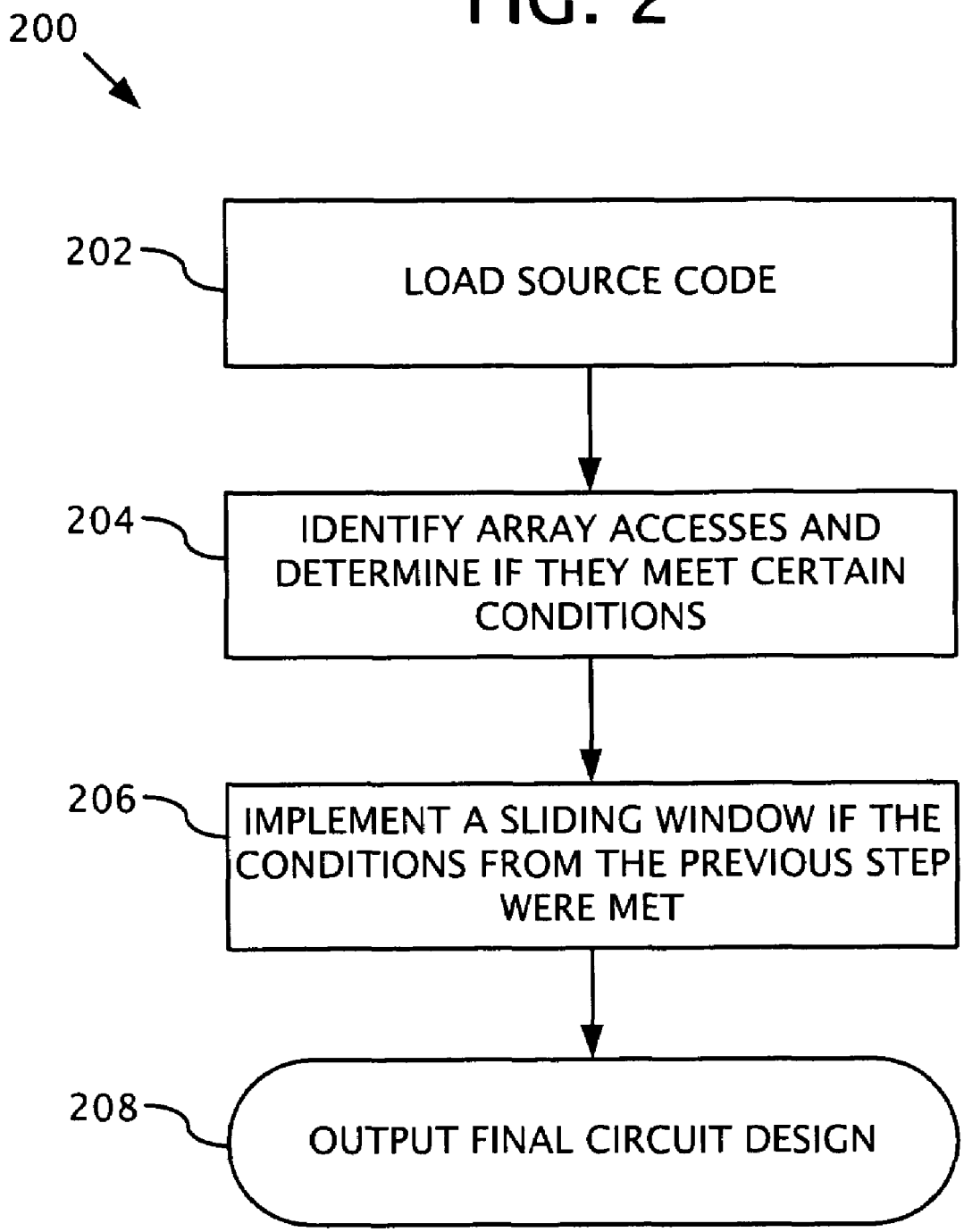
FIG. 2 is a flowchart showing an exemplary method for generating an integrated circuit according to a hardware design tool, such as the system shown in FIG. 1.

FIG. 2 shows a flowchart 200 for generating an integrated circuit according to a hardware design tool. The source code is loaded 202 into the design tool. The design tool identifies array accesses within the source code 204 and determines if they meet certain conditions. The design tool then implements a sliding window 206 if such conditions are met. A final circuit design is outputted 208.

Figure 3:
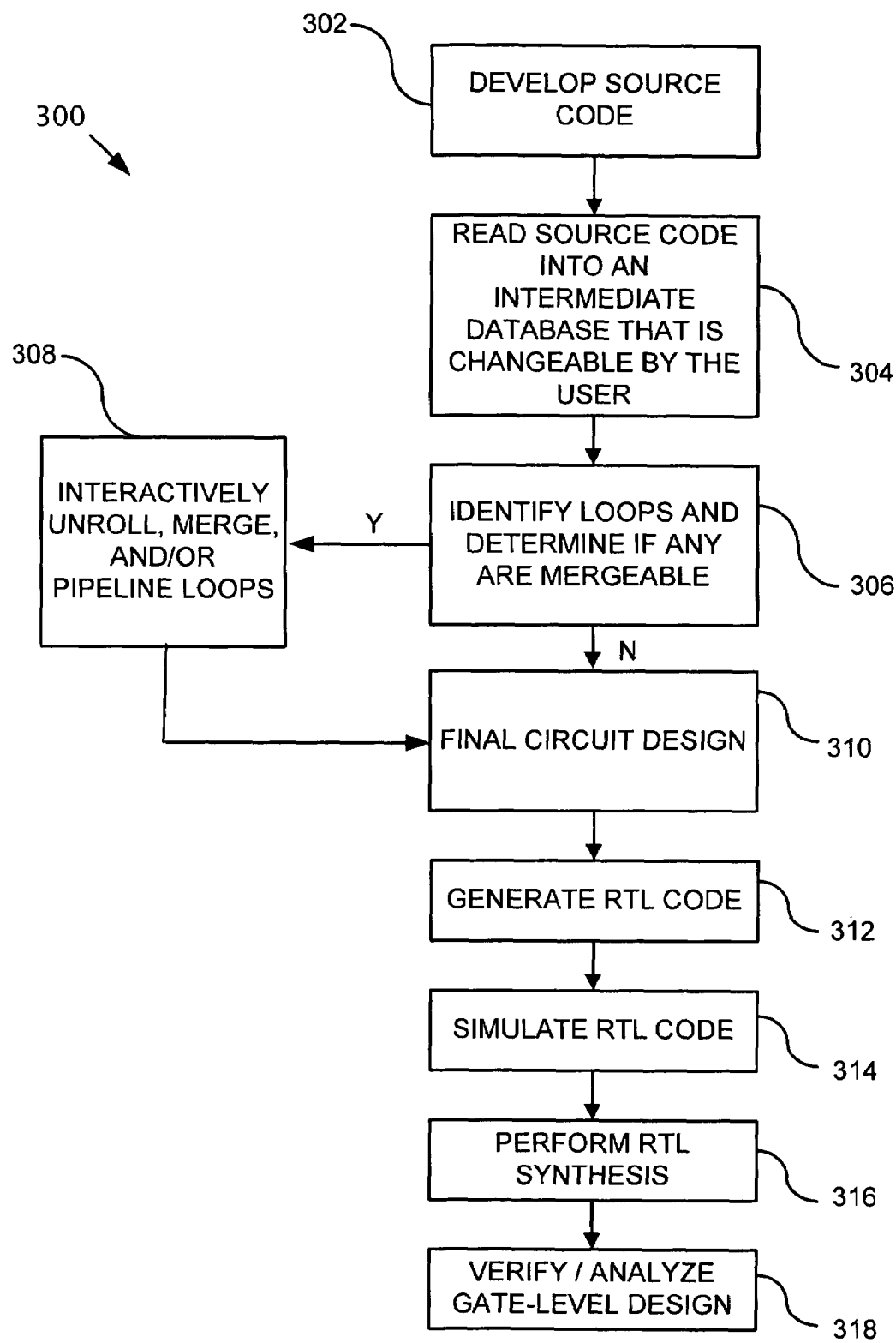
FIG. 3 is a flowchart showing another exemplary method for generating an integrated circuit according to a hardware design tool, such as the system shown in FIG. 1.

FIG. 3 shows another flowchart 300 for generating an integrated circuit according to a hardware design tool. In process block 302, the designer develops the source code as already described. The behavioral synthesis tool 104 of FIG. 1 reads the source code 304 into the intermediate database 106 of FIG. 1 and generates a data structure that is changeable by the designer. When generating the data structure, the synthesis tool performs an analysis of the source code. For example, the synthesis tool searches for operators, signals, and variables in the source code and generates the data structure based on these HDL statements. Additionally, the synthesis tool searches for directives and uses the directives and/or a set of default selections to set a hardware description in the data structure. The data structure is a data model that can represent loops in a variety of forms the most general being a mapping of the source code such as when first read into the behavioral synthesis tool.

At 306, an identification of any loops in the design is made and a determination is made as to whether any of the identified loops are mergeable. If two or more loops are identified as mergeable, then the designer is provided an opportunity to unroll, merge, or pipeline 308 the mergeable loops. Loop merging might involve, but is not limited to, inserting the loop body of one loop into the loop body of another loop, thereby forming a single loop that might be faster or expose additional optimization possibilities. The circuit design may then be finalized 310. Further steps in the process might include generating RTL code 312, simulating the RTL code 314, performing RTL synthesis 316, and verifying/analyzing the resulting gate-level design 318.

Exemplary Programming Language

The examples disclosed herein generally describe embodiments involving code written in the C language. However, it should be apparent that these examples are illustrative only and should not be construed as limiting the scope of the disclosed technology. For example, the disclosed technology can be implemented using any of a wide array of programming languages and data structures.

Arrays and Memories in an Integrated Circuit Design

A memory generally refers to a physical hardware unit that allows for the storage and retrieval of data by a numerical addressing scheme. When a design is synthesized from a behavioral description, an array is the corresponding data type to model the behavior of a memory. Thus, a memory is usually the appropriate implementation of an array.

For each array or memory, there is a fixed data block (e.g., a memory word) that can be written to and read from simultaneously. From a behavioral view, an array or memory can usually be characterized by the size and number of words. The first parameter of a memory is the wordsize, which is the number of bits read or written in a single access. The second parameter is the number of words a memory can store. Each word has a unique address under which it can be read or written, which is usually a number from 0 to wordcount−1. Arrays can usually be indexed by an expression computed during runtime. Memories can have parameters (e.g., number of ports) in addition to the two parameters mentioned above.

The following example illustrates the possible mapping to an array.

TABLE 3

```
// array declaration 10 words 8 bits wide
int_8 F[10];
//example read access
x = F[1];
```

TABLE 3-continued

```
//example write access
F[j] = y;
```

The example code shown in Table 3 above defines an array F of 10 words, each 8 bits wide, and exemplary read and write accesses. One way to map this array is direct mapping. In this example, that means the array is mapped to a memory section of the same wordsize and wordcount. Each array access results in one memory access. There is no address conversion and array indexes can be used directly as memory addresses.

TABLE 4

```
// memory declaration
int_8 Mem1[10];
//transformed array read
x = Mem1[i];
//transformed array write
Mem1[j] = y;
```

The memory access after mapping can be specified as the code shown above in Table 4.

Video Line Filters

Finite impulse response (FIR) filters are commonly employed in video applications such as image pre-processing or enhancement. Although video consists of a sequence of two-dimensional images, one-dimensional DSP algorithms are typically used to perform a variety of tasks such as sample-rate conversion and filtering. These one-dimensional filtering operations are routinely performed in the horizontal direction since video is generated and sampled as a sequence of horizontal lines.

Although describing a video line filter algorithmically in C is generally an easy task, the standard coding style suffers from two problems when trying to code high-performance synthesizable C code: non-causality, and non-linearity at the line boundary. The non-causal nature of these filters can create a performance bottleneck because multiple non-sequential memory accesses are required to compute each filter output. These non-sequential memory accesses can be difficult to synthesize efficiently because the accesses become non-linear at the line boundaries due to the use of standard clipping functions.

Loop Iteration Counters

A loop iteration counter generally represents the number of times the body of a loop has been executed since the start of the loop. The number of times a loop iterates before exiting may either be a constant or may be data dependent. Regardless of whether the number of iterations is a constant, there may be a statically determinable maximum known as maximum loop iterations. In general, a loop iteration counter starts at zero for the first iteration of a loop. In each iteration of the exemplary loop shown in Table 3 below, the variable x at the beginning of each iteration of the loop is equal to 100 minus 2 times the loop iteration counter.

TABLE 5

```
int x = 100;
while (x) {
    x = x - 2;
    ...
}
```

Loop Merging

Loop merging is a technique that can be used to reduce latency and area consumption in a design by allowing parallel execution of loops that would normally execute sequentially. Generally, loop merging involves the re-ordering of statements within loops that are merged. In one embodiment, loop merging is the replacing of two separate loops, each of which is executed sequentially, with a single but equivalent loop. In this embodiment, the body of the merged loop is constructed from the bodies of the single loop such that the merged loop performs the same function or functions as the two separate loops. A tool may need to ensure that the order of operations may be changed globally and also that a merged loop, when executed, executes the statements of each of the separate loops prior to merging under the correct condition and the correct number of times.

TABLE 6

```
a = 0;
Loop1: for (int j = 0; j < 10; j++) {
    a = a + 1;
    b[a] = c[a*3+2];
    subloop1: for ( ... ) {
        ...
    }
}
Loop2: for (k = 0; k < 10; k++) {
    x[k] = c[100-k];
    subloop2: for ( ... ) {
        ...
    }
}
Loop3: for (k = 1; k < 10; k++) {
    out[k] = b[k-1];
}
```

In one example, three mergeable loops are merged together. Three exemplary loops are shown above in Table 6.

TABLE 7

```
a = 0;
Loop1: for (int j = 0; j < 10; j++) {
    a = a + 1;
    b[a] = c[a*3+2];
    subloop1: for ( ... ) {
        ...
    }
    x[j] = c[100-j];
    subloop2: for ( ... ) {
        ...
    }
}
Loop3: for (k = 1; k < 10; k++) {
    out[k] = b[k-1];
}
```

Using the exemplary loops shown in Table 6, the first step might include merging Loop1 with Loop2, resulting in the new Loop1 as shown above in Table 7.

TABLE 8

```
Loop1: for (int j = 0; j < 11; j++) {
    if ( j < 10 ) {
        a = a + 1;
        b[a] = c[a*3+2];
        subloop1: for ( ... ) {
            ...
        }
        x[j] = c[100-j];
        subloop2: for ( ... ) {
            ...
        }
    }
    if ( j > 0 )
        out[j] = b[j-1];
}
```

Once two loops have been merged, it may be possible to merge the merged loop with other loops. In the example, now that Loop1 and Loop2 have been merged together, the resulting loop structure may be merged with Loop3, resulting in the new Loop1 as shown above in Table 8.

The above steps might be repeated for the loop structure shown in Table 8. For example, since the first hierarchy of loops has been merged, the subloop1 and subloop2 loops could be merged if they are both mergeable.

Loop merging often involves a complicated transformation having to deal with combinations of various loops (e.g., for- loops, while- loops, and until- loops) and any number of additional loop controls (e.g., continue and break statements). Many of these constructs are often used for the clarity and readability of the program and also for the convenience of the programmer, but the same functionality can sometimes be expressed without them. For example, many C language manuals define the behavior of a for-loop by giving an equivalent while-loop.

Loop Dependencies

If multiple statements within a loop are independent, then they can usually be reordered (e.g., switched). A data dependency generally occurs when a first statement assigns a value to a variable that is subsequently used in a second statement. An anti-dependency is usually said to occur when a second statement assigns a value to a variable that is used in a first statement.

TABLE 9

```
x = a * b;
y = c + d;
```

TABLE 10

```
y = c + d;
x = a * b;
```

The two statements shown above in Table 9 are independent because neither statement assigns values to any variables that are used by the other statement. Thus, the two statements can be reordered (e.g., as shown above in Table 10).

TABLE 11

```
x = a * b;
y = x + c;
```

The two statements shown above in Table 11 are data dependent because the variable x is written in the first statement and read in the second statement. This means that the result of the multiplication in the first statement is used as an argument of the addition in the second statement. Thus, the multiplication may be said to have a data dependency to the addition and must therefore be performed prior to the addition.

TABLE 12 x = y * a;
y = b + c;

TABLE 13 x = y * a;
y_tmp = b + c;
y = y_tmp;

TABLE 14 y_tmp = b + c;
x = y * a;
y = y_tmp;

In one example, two statements (shown above in Table 12) demonstrate an anti-dependency, which means that they can not be switched directly. Since there is no data dependency, the dependency is between the assignments and not between the multiplication and the addition. One way to resolve the dependency is to add a temporary variable y_tmp to separate the addition from the assignment to y, as shown above in Table 13. The assignments to x and y_tmp are now independent and, therefore, the statements can be switched, as shown above in Table 14.

Loop Dependency Analysis

In some embodiments where multiple loops exist, an independent loop dataflow dependency analysis may need to be performed before any merging can take place. In an independent loop dataflow dependency analysis, every variable that is written by a loop might be identified for each loop in the design. A variable is considered to be written if there are any assignments to that variable inside of that loop or in any sub-loop. For each pair of loops in the same loop hierarchy, a check is made to see if a variable written in the first loop is read or written in the second loop.

In some situations, a loop dependency analysis might only apply to single statements. In other situations, such an analysis may apply to blocks of statements. Some decisions that might be made during analysis may include whether statements can be moved over a loop and whether two or more complete loops can be reordered.

In one example, using the three exemplary loops shown above in Table 6, Loop1 writes to the variables "a," "b," and "j," and reads the variables "a," "c," and "j". Loop1 is also considered to read and write any variables that are read and written in the subloop1 loop. Loop2 writes "k" and "x," reads "k" and "c," and reads/writes all of the variables in subloop2. Loop3 writes "k" and "out," and reads "k" and "b."

In the example, an independent loop dataflow dependency analysis yields the following results: Loop1, Loop2, and Loop3 do not have dependencies to subloop1 and subloop2 because they are at different loop nesting levels. Loop1 has no dependencies to Loop2, assuming there are no dependencies in the subloops. Loop2 has no dependencies to Loop3, assuming there are no dependencies in the subloops. There is, however, a dependency between Loop1 and Loop3. That dependency is the variable b, which is written in Loop1 and read in Loop3. It should be noted that k is not considered to be the same variable in Loop2 and Loop3 because it is unconditionally written at the start of Loop3. The dependency for k may be resolved by creating a separate variable for k after the unconditional assignment.

In other examples, a dependent array access analysis may be performed. In such an analysis, for each array that is read or written inside of a loop and that is only indexed using a formula containing constants and loop iterators, an index into an array may be calculated as a formula based only on the loop iteration. In the exemplary loops shown above in Table 6, the access to "b" in Loop1 is equal to the loop iteration counter. The access to "b" in Loop1 is equal to the loop iteration counter plus 1. The access to "b" in Loop3 is equal to the loop iteration counter. Therefore, the dependency between Loop1 and Loop3 is essentially that Loop1 should start one iteration before Loop2.

Extraction of Partial Loop Dependencies

Loops generally can not be merged using independent loop merging techniques if there is a data dependency between them.

TABLE 15 int inp[16], tmp[14], out[12];
Loop1: for ( i = 0; i < 14; ++i ) {
    // Body1
    tmp[i] = inp[i]*3 + inp[i+1]*5 + inp[i+2]*3;
}
Loop2: for ( j = 1; j < 13; ++j ) {
    // Body2
    out[j-1] = - tmp[j-1] + tmp[j]*3 - tmp[j+1]*3;
}

TABLE 16

Body1.0
Body1.1
...
Body1.11
Body1.12
Body2.0
Body2.1
...
Body2.9
Body2.10

In one example, two loops (Loop1 and Loop2) are shown in Table 15 above. In the example, Loop1 computes values and stores them in array tmp. These values are then used in Loop2 to do further calculations. Loop1 must therefore be executed before Loop2, which reduces possible parallelism and increases execution time. If the loops are left unmodified, the iterations are executed in the order shown in Table 16 above, where BodyN.i denotes iteration number i of LoopN.

To explore parallelism, an analysis can be done to try to find dependencies between single iterations of the loop instead of between the loops as a whole. Such dependencies may be referred to as partial dependencies. This type of parallelism may be exposed by unrolling the loops because then partial dependencies would become normal dependencies. Unrolling is undesirable in some situations, however, because it might increase code size and remove regularity from the iterations.

TABLE 17

Body2.0 ( j = 1 ) depends on Body1.0, Body1.1, Body1.2
Body2.1 ( j = 2 ) depends on Body1.1, Body1.2, Body1.3
...
Body2.10 ( j = 11 ) depends on Body1.10, Body1.11, Body1.12

In the example, accesses to array tmp are regular and, if single iterations are taken into account, the data dependencies between the iterations of the loops can be more accurately described as shown above in Table 17.

TABLE 18

Body1.0
-----------
Body1.1
-----------
Body1.2
Body2.0
-----------
Body1.3
Body2.1
-----------
...
-----------
Body1.11
Body2.9
-----------
Body1.12
Body2.10

In the example, Loop2 could start after some iterations of Loop1 have been completed without violating any data dependencies. If both loops could be merged to a single loop and Body2 is deferred for two iterations, the merged loop would have 13 iterations and execute in the order shown above in Table 18. Here, Body1.ic computes tmp [i], which is used for the first time in Body2. (ic-2), where ic is the iteration counter of the respective loops.

TABLE 19

Body1.0
-----------
Body1.1
-----------
Body1.2
-----------
Body1.3
Body2.0
-----------
...
-----------
Body1.11
Body2.8
-----------
Body1.12
Body2.9
-----------
Body2.10

If Loop2 is deferred one more iteration than Table 18, the execution order shown above in Table 19 is achieved. There are now 14 iterations, but in each iteration there is no data dependency between the adjacent original bodies.

TABLE 20

```
Loop1: for ( i = 0; i < 16; ++i ) {
  a[i] = 0;        // (i) is a linear loop expression of Loop1
  Loop2: for ( j = 10; j; --j ) {
    a[i] +=        // (i) is a linear loop expression of Loop1
      x[3*j+1]+    // (3*j+1) is a linear loop expression of Loop2
      y[j*j]+      // (j*j) is a (nonlinear) loop expression of Loop2
      z[i+j];      // (i+j) is not a loop expression of either loop
  }
}
```

Partial dependencies can usually be derived from regular accesses to arrays, where dependencies can be tracked down to specific array elements and thus down to specific iterations. One step might be to analyze indexes into array accesses. An example shown above in Table 20 has two nested loops (Loop1 and Loop2) and shows loop expressions used for indexing of arrays. A loop expression is a term generally used to describe an expression inside a loop if it is a function of a loop iteration counter. If the loop has been unrolled completely, such expressions could be replaced by literal constants. A linear loop expression generally represents an expression whose value is a linear function of a loop iteration counter, which means that the value of the expression has a constant value in the first iteration and increases or decreases by a constant amount after each iteration of the loop.

The syntax of the language C allows access to the elements of an array by indexing it with an expression, which then retrieves one element of the array. Multi-dimensional arrays can generally be transformed into single-dimensional arrays by generation of appropriate expressions to access the arrays in one dimension. Words are usually blocks of bits (e.g., integer values). Such words are usually the smallest chunk of data that can be accessed independently. If only a few bits of an element are used, the whole array element may need to be retrieved, at which point the used bits can be selected by a method called bit-masking, where the element is anded with a constant (e.g., a[n]&1). Depending on the constant, the expression might only depend on the bits where the constant is '1', thereby effectively masking out all of the other bits.

TABLE 21

Word0 : MSB:Bit31 . . . LSB:Bit0
Word1 : MSB:Bit63 . . . LSB:Bit32
Word2 : MSB:Bit95 . . . LSB:Bit64
. . .

For purposes of analyzing data dependencies between array accesses, usually only used bits should be considered. Granularity of an access should generally not only be in chunks of elements but also for each bit. This usually requires one of various consistent addressing schemes for each bit in an array. In one example, a 'LittleEndian' addressing scheme might be used, which means that the least significant bit (LSB) has the lowest bit index in each element. Assuming an element has 32 bits, the bit addresses shown above in Table 21 are used. In the general case of the example, Word(i) consists of the bits from MSB:Bit((i+1)*wordlen-1) to LSB:Bit(i*wordlen). Thus, if Word (i) is anded with a constant bitmask, the slice can be reduced further, depending on the value of the bitmask.

Array accesses with a linear loop expression as index can be described as quadrupels (e.g., consisting of Array, Bitpos, Bitlen, Bitincr), where Array is the name of the accessed array, Bitpos is the index of the rightmost bit in the first iteration, Bitlen is the number of consecutive bits accessed, and Bitincr is the number of bits Bitpos is increased each iteration. To extract a dependency between two loops, all common variables may need to be extracted. If there is no data dependency, the loops can be merged as independent loops. If there is a dependency, but the dependency is caused by a common array, the loops may still be partially dependent. Accesses on potential arrays can be extracted as quadrupels. If only one of the accesses in either loop is not indexed by a linear loop expression, then the analysis will likely fail and the loops are probably fully dependent. Otherwise, each access in the first loop should be compared with each element in the second loop.

In one example, let (Array, Bitpos1, Bitlen1, Bitincr1) and (Array, Bitpos2, Bitlen2, Bitincr2) be array accesses in Loop1 and Loop2, respectively, on a common array. Two conditions, under which the accesses are fully independent, can be checked first. Under the first condition, if a loop has a maximum iteration count, which is typical for for-loops, a total range for the index can be computed. Also, if Bitincr is 0, a total range can be computed even if the loop does not have a maximum iteration count. If both accesses have a total range and the total ranges do not intersect, then the accesses are independent. Under the second condition, where GCD is the greatest common divisor of its arguments, if Bitlen1+Bitlen2 is less than or equal to GCD(Bitincr1, Bitincr2) and (Bitpos1−Bitpos2) modulus GCD(Bitincr1, Bitincr2) is not in the exclusive range between −Bitlen2 and Bitlen1, then the accesses are also independent.

If these two cases do not match and the first loop has a maximum iteration count maxLoop1, then the accesses may still be partially dependent. The grade of dependency can be measured by how many iterations Loop1 has to complete before the first iteration of Loop2 can start. This number may be called the iteration offset. If the iteration offset is 0, then the loops are independent and can be merged without offset. If the iteration offset is greater or equal to the maximum number of iterations of Loop1, then Loop1 should be completed before Loop2 is started, and the loops are fully dependent. If the iteration offset is between these two values, the loops are partially dependent and can be merged partially.

TABLE 22

```
if Bitincr1 > 0 then
    offset = maxLoop1 + 1 − (Bitpos1 + Bitincr1*maxLoop1 − Bitpos2 −
Bitlen2) / max(Bitincr1, Bitincr2)
else if Bitincr1 < 0 then
    offset = maxLoop1 + 1 − (Bitpos2 − Bitpos1 − Bitlen1 −
Bitincr1*maxLoop1) / max(−Bitincr1, −Bitincr2)
else if Bitincr2 > 0 then
    offset = maxLoop1 + 1 − (Bitpos1 − Bitpos2 − Bitlen2) / Bitincr2
else if Bitincr2 < 0 then
    offset = maxLoop1 + 1 − (Bitpos2 − Bitpos1 − Bitlen1) / −Bitincr2
else
    offset = maxLoop1
```

To compute the required offset in the example, the formulas shown above in Table 22 can be used.

TABLE 23

| | | | |
|---|---|---|---|
| in Loop1 | | | |
| (A) tmp[i] | (tmp, 0, 32, 32) | | |
| in Loop2 | | | |
| (B) tmp[j−1] | (tmp, 0, 32, 32) | Loop starts with j=1 | |
| (C) tmp[j] | (tmp, 32, 32, 32) | | |
| (D) tmp[j+1] | (tmp, 64, 32, 32) | | |

In the example shown above in Table 15, both loops access array tmp. Therefore, all accesses to the array tmp should be analyzed (as shown above in Table 23). The offset for pair (A, B) is 0 because Loop2 reads the value written by Loop1 in the same iteration. The offset for pair (A, C) is 1 because Loop2 reads the value computed by Loop1 one iteration later. The offset for pair (A, D) is 2 because Loop2 reads the value computed by Loop1 two iterations later. Thus, the total minimum offset in the example results in having to run Loop1 two iterations ahead of Loop2.

Loop Normalization

One exemplary step in loop merging can involve the transformation of all affected loops into conditionless while-loops. For example, for-loops can usually be transformed into while-loops and exit conditions in while- and do-while-loops can usually be replaced by conditional break statements in the beginning or end of the loop or loops in question. These transformations can often be derived from definitions in a corresponding language reference manual.

Another or alternative exemplary step might involve the processing of continue and next statements. In merged loops, these statements may apply to a common loop and control bodies of the other loop or loops. The complexity may be handled by bringing all continue and next statements into a specified normal form, in which there is no continue statement and, at most, one conditional break statement at the end of the loop.

A continue statement generally ends the current iteration of a loop and immediately starts the next iteration. Thus, a continue statement can often be replaced by the setting of a flag variable and making statements following the flag variable conditional.

A break statement generally ends the current iteration of a loop and exits the loop. A break statement can often be replaced by the setting of a flag variable and making statements following the flag variable conditional and exiting the loop at the end of the body with a single break statement. This final break statement would thus be the only break statement left in the loop.

After loop normalization, it may be desirable to execute each loop body until the condition of the terminating break turns true. If the loops are independent, the bodies can be executed in any order and only the correct number of iterations should be preserved. Since the common loop should run until both bodies have executed enough times, but the number of times can differ between loops, each body may need to be enclosed in an if-statement. Such an if-statement can block further execution of iterations once the exit condition is true. The common loop can thus terminate when both exit conditions are true.

Intermediate Statements

Another exemplary step in loop merging may include the moving of intermediate statements. For example, statements between loops may exist that can be merged. Such statements may have existed from the start of the process or may have been generated as a result of loop normalization.

In one example, there are intermediate statements between two loops (e.g., Loop1 and Loop2) that are to be merged. In the example, the intermediate statements should be moved to before Loop1 or after Loop2. If an intermediate statement has no data dependency to Loop1, then it can be moved to before Loop1. If any anti-dependencies exist, then some variables may need to be replaced by temporary variables prior to moving. If an intermediate statement has no data dependency to Loop2, then it can be moved to after Loop2. An anti-dependency to Loop2 can be resolved by the creation of temporary variables. An intermediate statement having data dependencies to both loops means that the loops are data dependent to each other and are thus not mergeable in this example.

Loop Unrolling

Loop unrolling is a technique that generally includes the duplication of the body of a loop and may expose more optimization methods, such as loop merging. Once the number of loop iterations has been determined, the loop may be unrolled based on unrolling constraints. Such unrolling might change the number of loop iterations. Unrolling or partially unrolling of a loop previously initially identified as a non-mergeable loop may result in the loop becoming at least partially mergeable. Loop unrolling may also expose parallelism between loop iterations. Loop unrolling can be performed, for example, after a loop has been normalized as a conditionless while-loop, in which case a loop body is simply duplicated.

Partial unrolling often involves a transformation where the body of a loop is duplicated one or more times such that one iteration of the unrolled loop performs two or more iterations of the original loop. The new loop thus performs the same functionality but with fewer iterations.

TABLE 24

```
Vertical: for(col = 0; col<DERICHE_WIDTH; col++)
{
   // Causal Treatment
   y_0 = y_1 = y_2 = 0;
   Vertical_Causal: for(lig=0; lig<DERICHE_HEIGHT; lig++)
   {
      y_2  = y_1;
      y_1  = y_0;
      y_0  = (pgmPixel)(a1*img_buffer[lig][col] + b1*y_1 + b2*y_2);
         img_buffer[lig][col] = y_0;
   }
   // Anti-Causal Treatment
   y_0 = y_1 = y_2 = 0;
   Vertical_AntiCausal: for(lig=DERICHE_HEIGHT; lig>0; lig--)
   {
      y_2  = y_1;
      y_1  = y_0;
      y_0  = (pgmPixel)(a1*img_buffer[lig-1][col] + b1*y_1 +
         b2*y_2);
         img_buffer[lig-1][col] = y_0;
   }
}
```

TABLE 25

```
Vertical: for(col = 0; col<DERICHE_WIDTH; col+=2)
{
   // Causal Treatment
   y_0 = y_1 = y_2 = 0;
   Vertical_Causal: for(lig=0; lig<DERICHE_HEIGHT; lig++)
   {
      y_2  = y_1;
      y_1  = y_0;
      y_0  = (pgmPixel)(a1*img_buffer[lig][col] + b1*y_1 +
         b2*y_2);
         img_buffer[lig][col] = y_0;
   }
   // Anti-Causal Treatment
   y_0 = y_1 = y_2 = 0;
   Vertical_AntiCausal: for(lig=DERICHE_HEIGHT; lig>0; lig--)
   {
```

TABLE 25-continued

```
      y_2  = y_1;
      y_1  = y_0;
      y_0  = (pgmPixel)(a1*img_buffer[lig-1][col] + b1*y_1 +
         b2*y_2);
         img_buffer[lig-1][col] = y_0;
   }
   // Causal Treatment
   y_0 = y_1 = y_2 = 0;
   Vertical_Causal_1: for(lig=0; lig<DERICHE_HEIGHT; lig++)
   {
      y_2  = y_1;
      y_1  = y_0;
      y_0  = (pgmPixel)(a1*img_buffer[lig][col+1] + b1*y_1 +
         b2*y_2);
         img_buffer[lig][col+1] = y_0;
   }
   // Anti-Causal Treatment
   y_0 = y_1 = y_2 = 0;
   Vertical_AntiCausal_1: for(lig=DERICHE_HEIGHT; lig>0; lig--)
   {
      y_2 = y_1;
      y_1 = y_0;
      y_0 = (pgmPixel)(a1*img_buffer[lig-1][col+1] + b1*y_1 +
         b2*y_2);
         img_buffer[lig-1][col+1] = y_0;
   }
}
```

In one example, none of the loops shown above in Table 24 are mergeable, even though the accesses to "img_buffer" are only dependent on loop iterators. In one embodiment, the Vertical loop can be partially unrolled two times, resulting in four loops where some merging is possible, as shown above in Table 25. In the example, loop unrolling needs to be applied before loop merging because before unrolling there were no mergeable loops, whereas after unrolling the following possibilities have been created: Vertical_Causal may be merged with Vertical_Causal_1 or Vertical_AntiCausal_1, and Vertical_AntiCausal may be merged with Vertical_Causal_1 or Vertical_AntiCausal_1.

In some embodiments, the order of merging is important because merging two loops may prevent the resulting loop from being merged. Therefore, a heuristic may be applied to determine the optimal set of loops to merge. Each loop that can be merged with another loop could be given an "edge," for example, wherein the merging that removes the fewest number of edges is selected and then the edges are re-generated. In the case of a tie, in one approach, the first mergeable loop is merged with the first loop it can be merged with. In the above example, that would mean that Vertical_Causal merge with Vertical_Causal_1.

Loop Pipelining

Loop pipelining involves determining how often to start the next iteration of a loop. In one embodiment, loop pipelining allows for the restructuring of a loop in a way that makes loop merging more complicated, so the pipelining transformation may desirably, in some examples, take place after loop merging. In some embodiments, merged loops can still be pipelined as long as merging doesn't create long feedback paths. In such embodiments, the second merged loop might start at least one iteration after the first if there are data dependencies.

Independent Loop Merging Example

This section details one of the many possible embodiments of the disclosed technology, more specifically with regards to independent loops. The code in the example is C code. Since C is a sequential language, the order of execution is strictly defined in this example by the language. How often each loop body is executed is usually defined by the programmer using loop statements such as for, while, continue, and break. While the example is in C code, the methods applied within the example are not limited to C code but apply to other such programming languages.

TABLE 26

```
Loop1: for ( i = 0; i < 4; ++i ) {
    // Body1
    if ( i == 2 )
        continue;
    a[i] = x[i] + y[i];
}
Loop2: for ( i = 8; --i; ) {
    // Body2
    b[i] = y[i] + z[i];
    if ( b[i] == 1 )
        break;
}
```

In the example, the C code in Table 26 above assumes that i and the arrays a, b, x, y, and z are declared and used somewhere else. During execution, this code performs certain computations and assigns values to the arrays a and b.

TABLE 27

```
Body1.0   (i is 0)
Body1.1   (i is 1)
Body1.2   (i is 2)
Body1.3   (i is 3)
Body2.0   (i is 7)
Body2.1   (conditionally if b[7] != 1, i is 6)
Body2.2   (conditionally if b[7] != 1 and b[6] != 1, i is 5)
...
Body2.6   (conditionally, i is 1)
```

TABLE 28

```
Body1.0   (i is 0)
Body2.0   (i is 7)
-----------
Body1.1   (i is 1)
Body2.1   (conditionally if b[7] != 1, i is 6)
-----------
Body1.2   (i is 2)
Body2.2   (conditionally if b[7] != 1 and b[6] != 1, i is 5)
-----------
Body1.3   (i is 3)
-----------
...
-----------
Body2.6   (conditionally, i is 1)
```

In the example, the native execution order is shown above in Table 27. Body1.N denotes one instance of the repeated execution of a loop body, where the first instance has index N=0. In the example, Body1 is executed exactly four times and Body2 is executed at most 7 times, but the break statement can abort the loop at any iteration. Since one goal of loop merging is to create a single loop with the same functionality as both loops prior to merging, a desired execution order of the merged loop might be that shown above in Table 28.

TABLE 29

```
Loop1: for ( i = 0; i < 4; ++i ) {
    // Body1
    if ( i == 2 )
        continue;
    a[i] = x[i] + y[i];
}
Loop2: for ( i2 = 8; --i2; ) {
    // Body2
    b[i2] = y[i2] + z[i2];
    if ( b[i2] == 1 )
        break;
}
i = i2;
```

In the example, arrays a and b are each only used in one of the loops. The other arrays x, y, and z are only read, so their use does not create a dependency. Only variable i is written in both loops and could be the cause of a dependency between the loops. Additional analysis shows that the final value of variable i is not used in Loop2, because Loop2 assigns a new value to it before using it the first time. This means that there is no data dependency and that the common use can be resolved by replacing i with i2 in Loop2. Such a transformation is shown above in Table 29.

TABLE 30

```
i = 0;
Loop1: while ( 1 ) {
    // Body1
    if ( i >= 4 )
        break;
    if ( i == 2 ) {
        ++i;
        continue;
    }
    a[i] = x[i] + y[i];
    ++i;
}
i2 = 8;
Loop2: while ( 1 ) {
    // Body2
    if ( --i2 == 0 )
        break;
    b[i2] = y[i2] + z[i2];
    if ( b[i2] == 1 )
        break;
}
i = i2;
```

TABLE 31

```
i2 = 8;
Loop2unrolled: while ( 1 ) {
    // Body2
    if ( --i2 == 0 )
        break;
    b[i2] = y[i2] + z[i2];
    if ( b[i2] == 1 )
        break;
    // Body2
    if ( --i2 == 0 )
        break;
    b[i2] = y[i2] + z[i2];
    if ( b[i2] == 1 )
        break;
}
```

TABLE 32

```
i = 0;
break_loop1 = false;
Loop1: while ( 1 ) {
    // Body1
    continue_loop1 = false;
    if ( i >= 4 )
        break_loop1 = true;
    if ( ! break_loop1 ) {
        if ( i == 2 ) {
            ++i;
            continue_loop1 = true;
        }
        if ( ! continue_loop1 ) {
            a[i] = x[i] + y[i];
            ++i;
        }
    }
    if ( break_loop1 )
        break;
}
i2 = 8;
break_loop2 = false;
Loop2: while ( 1 ) {
    // Body2
    if ( --i2 == 0 )
        break_loop2 = true;
    if ( ! break_loop2 ) {
        b[i2] = y[i2] + z[i2];
        if ( b[i2] == 1 )
            break_loop2 = true;
    }
    if ( break_loop2 )
        break;
}
```

Normalization techniques, as described above, are now desirably applied to the example. The first step in normalization for the example involves transforming loops into conditionless while-loops, resulting in the modified code shown above in Table 30. One particular note at this point in the example is that when transforming for-loops into while-loops, the loop increment may need to be executed before each continue statement. An optional step in the example is to unroll Loop2. Table 31 (above) shows Loop2 after being unrolled twice. The second step in normalization involves the processing of statements such as continue, next, and break, resulting in the modified code shown above in Table 32.

TABLE 33

```
i = 0;
break_loop1 = false;
i2 = 8;
break_loop2 = false;
Loop1: while ( 1 ) {
    // Body1
    continue_loop1 = false;
    if ( i >= 4 )
        break_loop1 = true;
    if ( ! break_loop1 ) {
        if ( i == 2 ) {
            ++i;
            continue_loop1 = true;
        }
        if ( ! continue_loop1 ) {
            a[i] = x[i] + y[i];
            ++i;
        }
    }
    if ( break_loop1 )
        break;
}
Loop2: while ( 1 ) {
```

TABLE 33-continued

```
    // Body2
    if ( --i2 == 0 )
        break_loop2 = true;
    if ( ! break_loop2 ) {
        b[i2] = y[i2] + z[i2];
        if ( b[i2] == 1 )
            break_loop2 = true;
    }
    if ( break_loop2 )
        break;
}
```

The next step is to investigate the potential moving of intermediate statements. In the example, the statements "i2=8" and "break_loop2=false" are moved over Loop1 because i2 and break_loop2 are not used in Loop1, resulting in the modified code shown above in Table 33. The loops are now ready to be merged.

TABLE 34

```
i = 0;
break_loop1 = false;
i2 = 8;
break_loop2 = false;
Merged_loop: while ( 1 ) {
    if ( ! break_loop1 ) {
        // Body1
        continue_loop1 = false;
        if ( i >= 4 )
            break_loop1 = true;
        if ( ! break_loop1 ) {
            if ( i == 2 ) {
                ++i;
                continue_loop1 = true;
            }
            if ( ! continue_loop1 ) {
                a[i] = x[i] + y[i];
                ++i;
            }
        }
    }
    if ( ! break_loop2 ) {
        // Body2
        if ( --i2 == 0 )
            break_loop2 = true;
        if ( ! break_loop2 ) {
            b[i2] = y[i2] + z[i2];
            if ( b[i2] == 1 )
                break_loop2 = true;
        }
    }
    if ( break_loop1 && break_loop2 )
        break;
}
```

Merging the two loops yields the modified loop shown above in Table 34.

A First Dependent Loop Merging Example

This section details another of the many possible embodiments of the disclosed technology, more specifically with regards to dependent loops.

TABLE 35

```
int inp[16], tmp[14], out[12];
Loop1: for ( i = 0; i < 14; ++i ) {
    // Body1
    tmp[i] = inp[i]*3 + inp[i+1]*5 + inp[i+2]*3;
}
Loop2: for ( j = 1; j < 13; ++j ) {
```

TABLE 35-continued

```
      // Body2
      out[j−1] = − tmp[j−1] + tmp[j]*3 − tmp[j+1]*3;
   }
```

In one example, using code shown above in Table 35, Loop1 computes data and stores the data in array tmp. The values of the data are then used in Loop2 for further computation.

TABLE 36

```
i = 0;
break_loop1 = false;
Loop1: while ( 1 ) {
   // Body1
   if ( i >= 14 )
      break_loop1 = true;
   if ( ! break_loop1 ) {
      tmp[i] = inp[i]*3 + inp[i+1]*5 + inp[i+2]*3;
      ++i;
   }
   if ( break_loop1 )
      break;
}
j = 1;
break_loop2 = false;
Loop2: while ( 1 ) {
   // Body2
   if ( j >= 13 )
      break_loop2 = true;
   if ( ! break_loop2 ) {
      out[j−1] = − tmp[j−1] + tmp[j]*3 − tmp[j+1]*3;
      ++j;
   }
   if ( break_loop2 )
      break;
}
```

The first step in the example is the application of normalization techniques described above. Transformation of the loops results in the modified code shown above in Table 36. One difference with respect to independent loop merging manifests itself here, in that the first iteration of Body2 can not be started right away but needs to be deferred until a certain number of iterations of Body1 have been executed. The number of iterations to defer results from a dependency analysis which in the example, is 3.

TABLE 37

```
i = 0;
break_loop1 = false;
j = 1;
break_loop2 = false;
defer_cnt = −3;
Merged_loop: while ( 1 ) {
   if ( ! break_loop1 ) {
      // Body1
      if ( i >= 14 )
         break_loop1 = true;
      if ( ! break_loop1 ) {
         tmp[i] = inp[i]*3 + inp[i+1]*5 + inp[i+2]*3;
         ++i;
      }
   }
   if ( defer_cnt < 0 )
      ++defer_cnt;
   else if ( ! break_loop2 ) {
      // Body2
      if ( j >= 13 )
         break_loop2 = true;
      if ( ! break_loop2 ) {
         out[j−1] = − tmp[j−1] + tmp[j]*3 − tmp[j+1]*3;
```

TABLE 37-continued

```
         ++j;
      }
   }
   if ( break_loop1 && break_loop2 )
      break;
}
```

Blocking Body2 for a certain number of iterations can be achieved by having a counter variable that is initialized by the number of iterations to block. Such a variable can be decremented each iteration until it reaches 0 and, from then on, Body2 can be executed, resulting in the merged loop shown above in Table 37.

A Second Dependent Loop Merging Example

This section details another of the many possible embodiments of the disclosed technology, more specifically with regards to dependent loops with partially intermediate operations.

TABLE 38

```
i = 0;
Loop1: while ( 1 ) {
   // Body1
   tmp[i] = inp[i] = inp[i+1];
   if ( i == 16 )
      break;
   ++i;
}
tmp[4] = tmp[9];
j = 0;
Loop2: while ( 1 ) {
   // Body2
   out[j] = tmp[j] + tmp[j+1];
   if ( j == 15 )
      break;
   ++j;
}
```

In the example code shown above in Table 38, the intermediate operation "tmp[4]=tmp[9]" has a data dependency to both loops and thus can not be moved over one of the loops. In a merged loop, it needs to be executed in one specific iteration. In the example, it needs to be executed after iteration 9 (i=9) of the first loop and before iteration 3 (j=3) of the second loop.

TABLE 39

```
i = 0;
break_loop1 = false;
j = 0;
break_loop2 = false;
defer_cnt = −7;
Merged_loop: while ( 1 ) {
   if ( ! break_loop1 ) {
      // Body1
      tmp[i] = inp[i] = inp[i+1];
      if ( i == 16 )
         break_loop1 = true;
      ++i
   }
   ++defer_cnt;
   if ( defer_cnt == 3 )
      tmp[4] = tmp[9];
   if ( defer_cnt >= 0 && !break_loop2 ) {
      // Body2
      out[j] = tmp[j] + tmp[j+1];
      if ( j == 15 )
```

TABLE 39-continued

```
            break_loop2 = true;
        ++j
    }
    if ( break_loop1 && break_loop2 && defer_cnt >= 3 )
        break;
}
```

To merge the loops and to bind the intermediate operation to a certain iteration in the example, the defer-counter variable (defer_cnt) should be extended to count positive loop iterations so that its value can be used as a condition to execute the intermediate operation exactly once it is in the correct iteration. Merging the loops results in the single merged loop shown above in Table 39.

Implementation of a Sliding Window for Array Access

In some cases, arrays are used in a pattern where only a few of the elements need to be stored. For example, this can happen where array elements are written and then used within the same iteration or the next few iterations.

Programmers familiar with functional programming languages typically implement this style in situations where variables cannot be reassigned. Such functional languages were considered closer to hardware and some of them are still in use by designers. Programmers also implement this style of code in situations where dependent loop merging takes place. In such situations, the array was completely filled by one loop and completely consumed by another loop. Merging the loops can increase efficiency, and implementation of a sliding window can increase efficiency even more.

Sliding windows can usually be implemented in situations where every access of an array inside a loop is a linear loop expression and every access of the array outside the loop is a constant index. Each index inside the loop should have the same increment in their linear expressions (e.g., the accesses inside each iteration are equally distanced from each other). If the array is used after the loop, the loop should also have a determined number of iterations.

A First Sliding Window Implementation Example

This section details an exemplary sliding window implementation.

TABLE 40

```
int inp[10], tmp[12];
. . .
tmp[0] = 0;
tmp[1] = 1;
//Loop
for (i = 1; i <= 10; ++i){
    //Body
    tmp[i+1] = tmp[i-1] + tmp[i] + inp[i];
}
out = tmp[11];
```

TABLE 41

```
Body0 (i=1):  uses tmp[0]  tmp[1]   tmp[2]
Body1 (i=2):  uses tmp[1]  tmp[2]   tmp[3]
. . .
Body9 (i=10): uses tmp[9]  tmp[10]  tmp[11]
```

The code shown above in Table 40 qualifies for a sliding window implementation because i is a linear loop variable with a starting value of 1 and an increment of 1, all index expressions are linear terms in i with the same factor, each iteration uses a certain set of array elements, the indexes are constant both before and after the loop, and the loops have 10 iterations. This is demonstrated above in Table 41.

TABLE 42

| expression | start value | increment | substitution |
|---|---|---|---|
| i | 1 | 1 | tmp[i] -> tmp1 |
| i−1 | 0 | 1 | tmp[i−1] -> tmp0 |
| i+1 | 2 | 1 | tmp[j] -> tmp2 |

For each index expression, the value of the first iteration is calculated and each index is incremented for each iteration. The size of a window (e.g., a sliding window) is determined by the difference between the minimum and maximum index values in the first iteration. The array is replaced with a set of individual variables. The size of the window becomes the number of variables, and each array access is replaced by a single variable access. The substitutions shown above in Table 42 are performed.

At the end of the loop body, the variables are assigned to each other forming a set of shift registers. The variables are assigned so that, in the next iteration, the substituted variable contains the value of the array, which would be used after the index is incremented.

The array accesses with constant index before and after the loop are also substituted by the shift variables. The array accesses before the loop are directly transformed, whereas the array accesses after the loop should take into account how often the loop variable has been incremented.

TABLE 43

| expression | index value | substitution |
|---|---|---|
| 0 before loop | i=1 | tmp[0] = tmp[i−1] -> tmp0 |
| 1 before loop | i=1 | tmp[1] = tmp[i] -> tmp1 |
| 17 after loop | i=10 | tmp[11] = tmp[i+1] -> tmp2 |

In this example, tmp [17] can be transformed into tmp [i+2], which is substituted by tmp2, because the loop exits with i=16. This is demonstrated above in Table 43.

TABLE 44

```
int inp[10]
. . .
tmp0 = 0;
tmp1 = 1;
//Loop
for (i = 1; i <= 10; ++i){
    //Body
    tmp2 = tmp0 + tmp1 + inp[i];
    //Shifting window variables
    tmp0 = tmp1;
    tmp1 = tmp2;
}
out = tmp1
```

The example after transformation is shown above in Table 44. The array tmp is completely converted into the three shift variables tmp0, tmp1, and tmp2. This provides numerous advantages, such as saving needed storage area and the removal of all indexing from the variables. The variables can now be implemented by single registers without memory and indexing hardware. Additionally, the actual index computations, which include additions and subtractions, have been saved.

Alternatively, a sliding window can be implemented as a cyclic buffer. In such an implementation, the values are not shifted through the registers. The values remain stored in their assigned locations but the position to insert new elements moves instead. Such an implementation can be used for medium size windows, where the window is implemented as a memory or other storage medium that does not allow a simple shift operation.

TABLE 45

```
class buffer {
    int buf[30];
    int read_index;
    int write_index;
};
```

Consider an example for the implementation of a sliding window using the class shown above in Table 45, in which an element is added to the write_index position and then the write_index variable is incremented or decremented. The last element can be retrieved by using the read_index position and incrementing or decrementing it. Positions in the middle of the window can be retrieved using index arithmetic.

TABLE 46

```
class buffer {
    int buf[30];
    int read_index;
    int write_index;
public:
    void push_elem(int elem) {
        buf[write_index] = elem;
        write_index = (write_index + 1) % 30;
    }
    int pop_elem( ) {
        read_index = (read_index + 1) % 30;
        return buf[read_index];
    }
};
```

Shift registers and cyclic buffers can both be implemented using object-oriented methods and classes, thereby improving readability of the code and promoting code reuse. One example of such a class is shown above in Table 46. A common programming method is to group a data object with access functions into a single class object.

A Second Sliding Window Implementation Example

This section details another exemplary sliding window implementation, and involves such an implementation with a video line filter.

A higher performance video line filter can be achieved by restructuring its algorithm so that the filter memory accesses are mapped to a sliding window (e.g., a window implemented as a shift register). This sliding window effectively allows the filter to access the non-sequential memory locations simultaneously and allows the use of loop unrolling and pipelining.

TABLE 47

```
#define PIXELS 720
#define clip(x) (x < 0)? 0: (x > (PIXELS-1))? (PIXELS-1): x
#pragma hls_Design top
void fir(int8 x[PIXELS], int8 y[PIXELS])
{
    for(int i = 0; i < PIXELS; i++)
        y[i] = x[i]*125 -(x[clip(i-3)]+ x[clip(i+3)])*37 + (x[clip(i-1)]+ x[clip(i+1)]) *54;
}
```

A common C description of a low-pass video line filter with clipping is shown above in Table 47. This filter processes 720 pixels by reading them from external line buffer x and writes the result into line buffer y. The clipping function prevents the reads of x from under-flowing or overflowing the line buffer. An analysis of the data flow of this algorithm reveals that five reads of x are required to compute each value of y. This will limit the ability to unroll or pipeline the filter loop. The ability to merge the reads of x by widening the word width is blocked due to the use of the non-linear clipping function. This video line filter is non-optimal if high throughput is desired.

Figure 4:
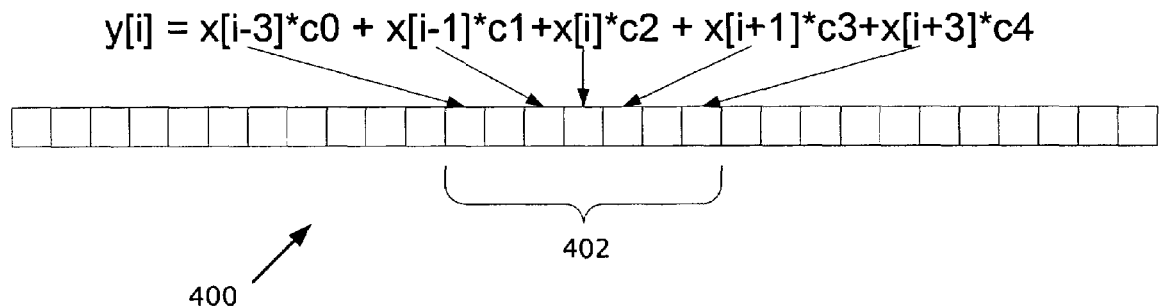
FIG. 4 is an illustration of a sliding window implemented in a shift register.

A much higher throughput design can be achieved if the code shown above in Table 47 is re-structured so that the memory accesses reduce to one per clock cycle. This can be accomplished by mapping the memory accesses onto a sliding window, as illustrated by the sliding window 402 implemented in the shift register 400 shown in FIG. 4.

TABLE 48

```
template<class intIn, const int NUM_TAPS>
class window{
    intIn _x[NUM_TAPS]; //Window registers
    int _pixels; //line length
    int _del; //input window delay
    int _del_out; //output window delay
```

The sliding window can be represented as a C++ class, as [partially] shown above in Table 48. This exemplary class is templatized to allow both the bit width (intIn) and the window size (NUM_TAPS) to be scaled. The class has several data members used to store the window data, line length, and delay variables. The delay variables can be used for the filter startup time and to cascade several filters together.

Behavioral Synthesis Tool Interaction with a User

In some circuit designs, it is desirable to merge all loops that can be merged (e.g., are mergeable). In one embodiment, a behavioral synthesis tool can be set to merge some or all mergeable loops based on a mergeable directive set by the user. Additionally, the mergeable directive may be set to a default value. For example, the mergeable directive may be set to a default value of TRUE, meaning that all mergeable loops might be merged without seeking permission for each individual mergeable loop. Should the user wish to set the tool to not automatically merge mergeable loops, he or she may do so by changing the mergeable directive to FALSE. In one embodiment, the mergeable directive may be set or changed through a graphical user interface (GUI).

In addition to a mergeable directive, it is sometimes desirable for a behavioral synthesis tool user to learn what impact the merging of mergeable loops within a design might have on the rest of the design. In one embodiment, a behavioral synthesis tool describes to a user what impact the merging of mergeable loops might have on the design. The following two tables demonstrate exemplary reports that can be generated.

TABLE 49

| Process | Loop | Iterations | C-Steps | Latency | Duration |
|---|---|---|---|---|---|
| /fir_filter/fir_filter_proc | fir_filter_proc | Infinite | 0 | 34 | 680.00 ns |
| /fir_filter/fir_filter_proc | fir_filter_main | Infinite | 2 | 34 | 680.00 ns |
| /fir_filter/fir_filter_proc | fir_filter_for | 8 | 1 | 8 | 160.00 ns |
| /fir_filter/fir_filter_proc | fir_filter_for_0 | 8 | 3 | 24 | 480.00 ns |

TABLE 50

| Process | Loop | Iterations | C-Steps | Latency | Duration |
|---|---|---|---|---|---|
| /fir_filter/fir_filter_proc | fir_filter_proc | Infinite | 0 | 26 | 520.00 ns |
| /fir_filter/fir_filter_proc | fir_filter_main | Infinite | 2 | 26 | 520.00 ns |
| /fir_filter/fir_filter_proc | fir_filter_merged | 8 | 3 | 24 | 480.00 ns |

A report such as that shown in Table 49 can be generated to detail the impact of not merging mergeable loops, whereas a report such as that shown in Table 50 can be generated to detail the impact of merging the mergeable loops.

Such description might be provided in response to a specific request made by the user, for example, through the tool's GUI. In another embodiment, such description is provided without prompting by the user whenever the mergeable directive is set to TRUE. Alternatively, the user could set the tool to not provide such description unless specifically requested by the user.

Distributed Computing Network

Figure 5:
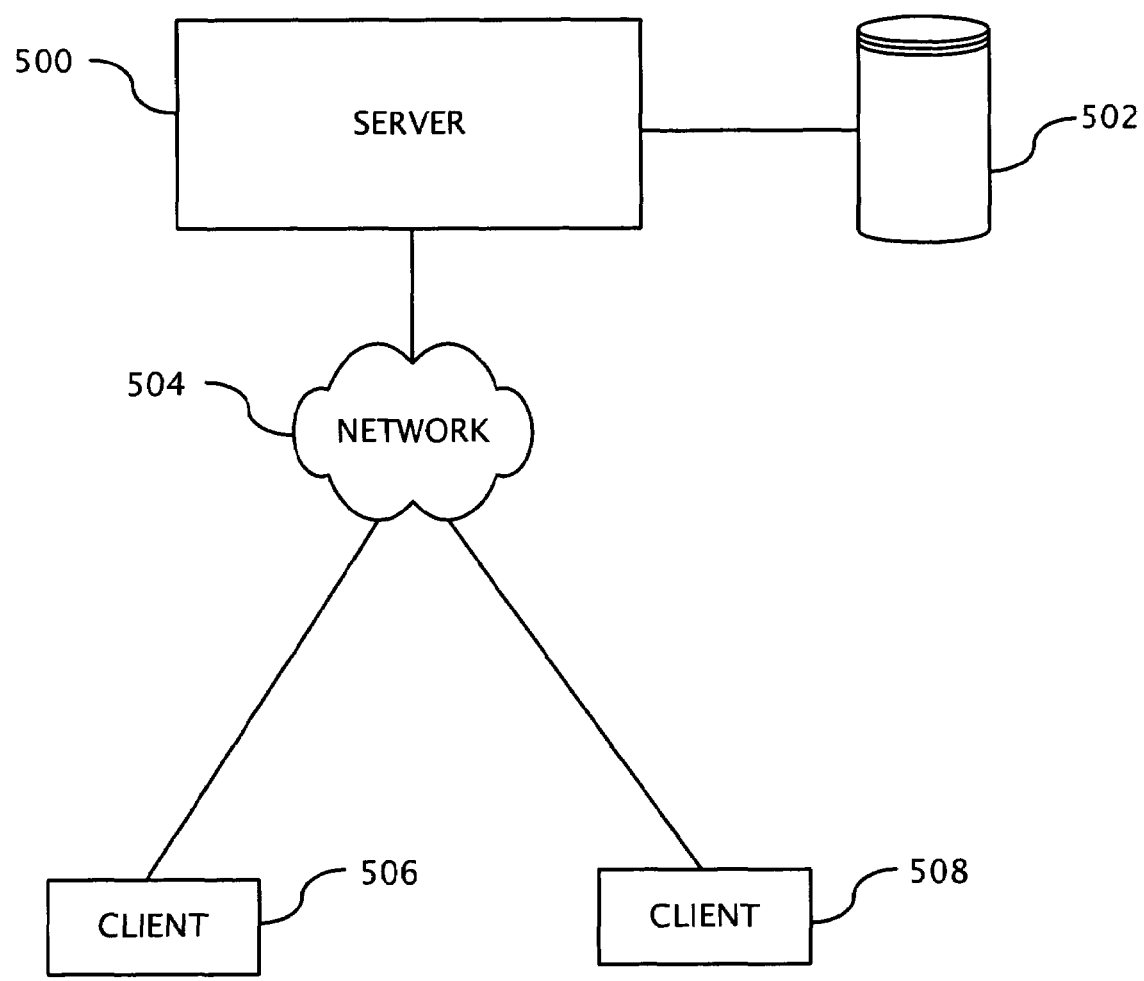
FIG. 5 is a system diagram of a client/server network as may be used in performing the disclosed methods.

Any of the aspects of the technology described above may be performed or designed using a distributed computer network. FIG. 5 shows one such exemplary network. A server computer 500 can have an associated storage device 502 (internal or external to the server computer). For example, the server computer 500 can be configured to process circuit designs using any of the embodiments described above (e.g., as part of an EDA software tool). The server computer 500 may be coupled to a network, shown generally at 504, which can comprise, for example, a wide-area network, a local-area network, a client-server network, the Internet, or other such network. One or more client computers, such as those shown at 506 and 508, may be coupled to the network 504 using a network protocol.

Database Modification

Figure 6:
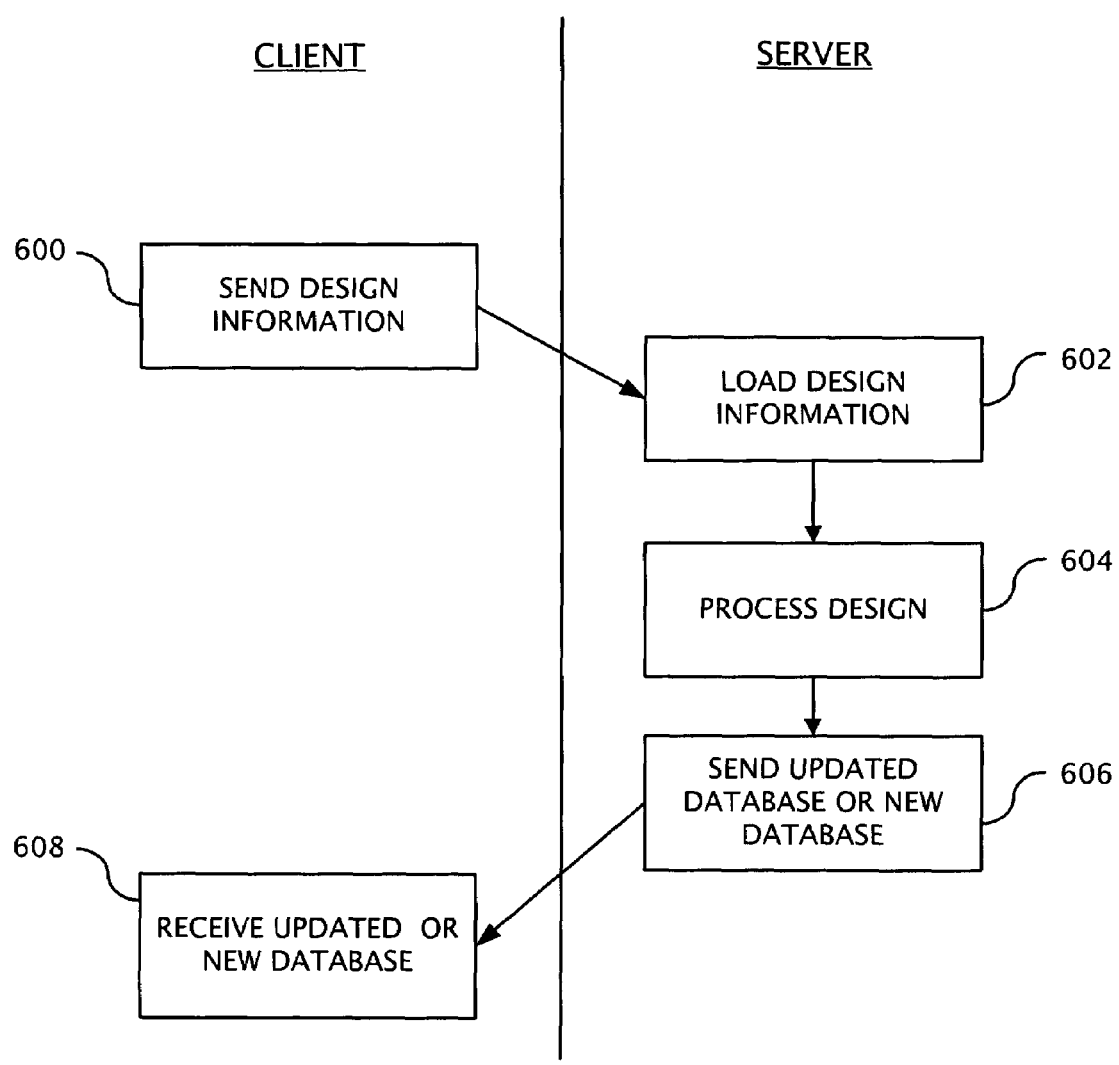
FIG. 6 is a flowchart showing the creation of a database using, for example, the network of FIG. 5.

FIG. 6 shows that a database containing design information (e.g., a netlist) may be updated (or modified) to include design information for a circuit synthesized according to any of the embodiments disclosed herein using a remote server computer, such as the server computer 600 shown in FIG. 6. In process block 600, for example, the client computer sends design data relating to a circuit. For instance, the client computer may send a netlist or other EDA design database.

In process block 602, the data is received and loaded by the server computer.

In process block 604, the circuit defined by the database is processed according to any of the disclosed embodiments.

A new database representing the resulting design can then be created. This new design data can be stored as an updated (or modified) version of the design database or as one or more separate databases.

In process block 606, the server computer sends the updated database or other databases to the client computer, which receives the database in process block 608. It should be apparent to those skilled in the art that the example shown in FIG. 6 is not the only way to update a design database to include the relevant design data. For instance, the design data may be stored in a computer-readable media that is not on a network and that is sent separately to the server. Or, the server computer may perform only a portion of the design procedures.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. In a behavioral synthesis tool used to design a hardware circuit, a method comprising:
   identifying a subset of variables from a multi-variable memory space that are accessed by a plurality of loops, wherein identifying a subset of variables comprises determining that a plurality of memory accesses from inside one of the plurality of loops comprises linear loop expressions;
   storing the subset of variables in a separately accessible memory space, wherein storing the subset of variables comprises constructing a sliding window, wherein the sliding window has a size determined at least in part by a value corresponding to how many variables the subset of variables comprises; and
   accessing one of the stored subset of variables to recover a stored value of the one of the stored subset of variables for use by at least one of the plurality of loops during synthesis.

2. The method of claim 1, wherein the sliding window is mapped to a shift register.

3. The method of claim 1, wherein the sliding window is mapped to a cyclic buffer.

4. The method of claim 1, wherein the sliding window is mapped to a message channel.

5. The method of claim 1, wherein the sliding window is represented as a C++ class.

6. The method of claim 1, wherein each of the subset of variables comprises an array and the sliding window is a subset of a multi-dimensional array.

7. The method of claim 6, wherein each of the subset of variables comprises a line buffer, the line buffer comprising a plurality of pixels, and the multi-dimensional array comprises a frame of video from a video data stream.

8. The method of claim 6, wherein the multi-dimensional array models video data in a video filter.

9. The method of claim 1, wherein the subset of variables are shared between a plurality of processes and the sliding window is synchronized between the plurality of processes.

10. The method of claim 1, further comprising unrolling at least one of the plurality of loops.

11. The method of claim 1, further comprising pipelining a sub-plurality of the plurality of loops.

12. The method of claim 1, further comprising reducing a plurality of accesses to a memory to one access per clock cycle.

13. A computer-readable medium having stored thereon computer-executable instructions for performing the method of claim 1.

14. The method of claim 1, wherein identifying a subset of variables further comprises determining that a plurality of memory accesses from outside the one of the plurality of loops comprises constant indexes.

* * * * *